United States Patent
Japp et al.

(10) Patent No.: US 8,198,551 B2
(45) Date of Patent: Jun. 12, 2012

(54) POWER CORE FOR USE IN CIRCUITIZED SUBSTRATE AND METHOD OF MAKING SAME

(75) Inventors: Robert M. Japp, Vestal, NY (US); Kostas Papathomas, Endicott, NY (US); John Steven Kresge, Binghamton, NY (US); Timothy Antesberger, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 208 days.

(21) Appl. No.: 12/782,187

(22) Filed: May 18, 2010

(65) Prior Publication Data

US 2011/0284273 A1  Nov. 24, 2011

(51) Int. Cl.
*H05K 1/11* (2006.01)
(52) U.S. Cl. .................................. 174/262; 174/266
(58) Field of Classification Search ............ 174/260–266
See application file for complete search history.

(56) References Cited

U.S. PATENT DOCUMENTS

| | | | |
|---|---|---|---|
| 5,120,339 A | 6/1992 | Markovich et al. | |
| 5,374,788 A * | 12/1994 | Endoh et al. ............... | 174/266 |
| 5,418,689 A | 5/1995 | Alpaugh et al. | |
| 5,574,630 A | 11/1996 | Kresge et al. | |
| 5,620,782 A | 4/1997 | Davis et al. | |
| 5,652,055 A | 7/1997 | King et al. | |
| 5,847,327 A | 12/1998 | Fischer et al. | |
| 6,073,344 A | 6/2000 | Japp et al. | |
| 6,204,453 B1 * | 3/2001 | Fallon et al. ............... | 174/255 |
| 6,259,037 B1 | 7/2001 | Feilchenfeld et al. | |
| 6,323,436 B1 | 11/2001 | Hedrick et al. | |
| 6,329,603 B1 | 12/2001 | Japp et al. | |
| 6,344,371 B2 | 2/2002 | Fischer et al. | |
| 6,465,084 B1 | 10/2002 | Curcio et al. | |
| 6,638,607 B1 | 10/2003 | Curcio et al. | |
| 6,645,607 B2 | 11/2003 | Curcio et al. | |
| 6,826,830 B2 | 12/2004 | Egitto et al. | |
| 6,829,823 B2 | 12/2004 | Downes, Jr. et al. | |
| 6,887,779 B2 | 5/2005 | Alcoe et al. | |
| 6,944,946 B2 | 9/2005 | Japp et al. | |
| 7,078,816 B2 | 7/2006 | Japp et al. | |
| 7,157,647 B2 * | 1/2007 | Lauffer et al. ............. | 174/262 |
| 7,301,108 B2 | 11/2007 | Egitto et al. | |
| 7,429,789 B2 | 9/2008 | Japp et al. | |
| 7,508,076 B2 | 3/2009 | Japp et al. | |
| 2003/0041046 A1 * | 2/2003 | Allison et al. ............... | 707/1 |
| 2006/0185141 A1 * | 8/2006 | Mori et al. ................. | 29/25.41 |

* cited by examiner

*Primary Examiner* — Hoa C Nguyen
(74) *Attorney, Agent, or Firm* — Mark Levy; Lawrence R. Fraley; Hinman, Howard & Kattell (57) ABSTRACT

A power core adapted for use as part of a circuitized substrate, e.g., a PCB or LCC. The core includes a first layer of low expansion dielectric and two added layers of a different low expansion dielectric bonded thereto, with two conductive layers positioned on the two added low expansion dielectric layers. At least one of the conductive layers serves as a power plane for the power core, which in turn is usable within a circuitized substrate, also provided. Methods of making the power core and circuitized substrate are also provided. The use of different low expansion dielectric materials for the power core enables the use of support enhancing fiberglass in one layer while such use is precluded in the other two dielectric layers, thus preventing CAF shorting problems in highly precisely defined thru holes formed within the power core.

29 Claims, 4 Drawing Sheets

POWER CORE FOR USE IN CIRCUITIZED SUBSTRATE AND METHOD OF MAKING SAME

FIELD OF THE INVENTION

The present invention relates to circuitized substrates, e.g., Printed Circuit Boards (PCBs), Laminated Chip Carriers (LCCs) and the like, and more particularly to power cores for use in such substrates. The present invention also relates to methods for fabricating such structures.

BACKGROUND OF THE INVENTION

Information handling systems such as computers and similar electronic equipment have become essential in the lives of many people today. Many businesses, banks, and governments rely on such systems, particularly computers, as part of their everyday activities. Because of the relatively complex demands placed on these systems, it is essential that said systems be highly reliable and stable. Computers today, for example, are required to run longer, operate at higher frequencies (signal speeds) and exhibit less downtime than at any time in the past. Accordingly, if each component utilized in such systems is designed to last longer and be more reliable, then each system in turn will last longer and be more reliable.

Because circuitized substrates are an essential part of many information handling systems, particularly computers (where several may be found in each), the emphasis on reliability is likewise placed on such substrates. Most components in a computer system are designed by placing semiconductor packages, containing one or more semiconductor chips, onto a PCB or by placing chips directly onto LCCs and connecting the LCCs to the PCB. The PCB circuit lines connect the semiconductor packages or chips together. PCBs can be as simple as a dielectric layer that has lines on one or both sides and one or more packages attached to one or both sides. PCBs used today are generally much more complex, however, and are usually made of metal power and ground planes and several signal planes containing circuit lines sandwiched in an alternative manner between several layers of dielectric material, often with metal lines and pads on the top and bottom surface of the multilayered "sandwich." Top and bottom conductors may be connected with one other as well as with selected internal circuit layers using conductive "thru holes", e.g., Plated Through Holes (PTHs).

In a typical method of making a circuitized substrate such as a PCB or LCC, one starting material is usually a sheet consisting of fiberglass and epoxy resin. This is often termed "pre-preg" because the fiber is impregnated with resin during preliminary processing. The resin essentially acts a binder to bind fiber into a board. In place of the fiberglass cloth, it is possible to use compressed paper or other suitable materials, examples of which are described in some of the patents cited below. The basic structure formed at this stage is therefore a flat, rigid or slightly flexible dielectric material that will be fabricated into the final circuitized substrate. This starting material may be laminated with a thin layer of copper on both sides of the board with suitable adhesion. This combination is commonly called copper clad laminate (CCL) if copper is chosen as the outer conductive layer (and if it is laminated to the dielectric layer). These CCLs can either become simple double-sided substrates (having two sides of copper lines) or may be circuitized and thereafter laminated with additional dielectric and/or conductive layers to form larger, thicker multilayered circuitized substrates. In almost all cases, holes are provided (usually by drilling) through these substrates to accommodate electrical connection of the various electronic components that will be attached as well as selected internal conductors. The holes are usually drilled using high speed drilling machines or, of more recent vintage, high speed lasers. In order to make effective electrical connections for this substrate, holes must be formed. When these holes extend through the dielectric, the "plastic" (dielectric material) wall of the hole must be made conductive. This is typically accomplished by a chemical plating process commonly known in the industry as metallization, the process consisting of a relatively complicated series of chemical tanks and rinses and an activating step to apply a thin copper layer to the hole walls. Specifically, in almost all cases, copper electroplating is used to deposit a relatively thick layer of copper in the holes in order to form a suitable copper cross section for carrying current. Copper plating can be followed by tin-lead or tin plating in order to improve solderability, if desired.

Circuitization of the selected conductive layers on the internal dielectric layered structures as well as the outer conductive layers (if used) is typically is accomplished by forming an image of the desired circuit pattern, this image typically formed by applying an organic photoresist coating over the metal layer. Ultraviolet (UV) light is then projected through a mask onto the photoresist, the mask containing a pattern of shapes that block selected parts from the impinging UV light. When using negative photoresist, the areas of the photoresist that are not exposed to the UV light are removed during the subsequent development step. Chemical etching is then used to remove the exposed surface metal. Next, the remaining photoresist is stripped, leaving only the metal pattern.

PCBs made in this manner have substantially become the standard in electronics. Advances in manufacturing processes have made many PCBs and LCCs less expensive, and relatively easier to make. There are still, however, problems associated with these products, many of which are brought on by the aforementioned demands for greater capabilities while offering a smaller scale final product. One of the causes of some problems is a non-optimal (excessive) coefficient of thermal expansion (CTE) mismatch for the overall PCB and the individual layers. Many PCBs and LCCs are generally composed largely of organic materials, and thus tend to have a higher CTE that is not well matched to the CTE of the silicon chip or chips positioned thereon. When trying to reduce the CTE of the PCB/LCC, a variety of dielectrics with lower CTEs are available. However, the effectiveness of using these lower CTE dielectrics is sometimes limited because the power and ground planes, which constitute a significant portion of the PCB, are still composed of a highly electrically conducting metal, typically copper or copper alloy. Copper has a relatively high CTE compared with some of the lower CTE dielectric materials. The relatively high CTE, large amount and high tensile modulus of copper all combine to act to maintain a high composite CTE for the formed (laminated) circuitized substrate. Because the overall CTE is relatively high (compare to the chip(s) which is (are) usually comprised of silicon), the PCB or LCC tends to lengthen and grow in size with increasing temperature. This increase in size means that the chips, packages, lines, and other devices on the surfaces of the PCB or LCC need to expand at the same rate or be able to tolerate the stress caused by the mismatch in size. Sometimes these devices or the electrical connections between them cannot withstand the stress, particularly after repeated temperature cycling.

When solder is used to bond the devices to the substrate (e.g., a chip is connected to the LCC through small solder bumps some of which are called Controlled Collapse Chip Connections (C4) in the art), excessive expansion of the supporting structure may result in damage and even separation of the various solder bonds, thereby rendering the package inoperable for the intended purpose. One effort to prevent this is to use an encapsulation and/or undercoating material which is placed under and around the solder bonds. This adds of course to the total package cost and is not always completely effective when extremely high temperatures might be encountered or if the CTE mismatch is excessive. Further, the chip/PCB or LCC CTE mismatch may result in the assembled package warping, putting tensile stress on the chip to the extent that it might crack and thus be destroyed. Yet another adverse result caused by the CTE differential is shear induced de-bonding, where the dielectric may in fact be torn from the power/ground planes. Shear induced de-bonding exacerbates the CTE-caused cracking mechanisms because the de-bonded dielectric is essentially "floating" and is not connected to the metallic power/ground planes. The periphery of the de-bonded area is, however, typically connected to a metallic plane and tends to move with the metallic plane as the plane lengthens with increasing temperature. Cracking could then occur around the periphery as the periphery moves away from the de-bonded dielectric.

It is thus readily understood from the foregoing that the closer the CTE match between the various elements of a multilayered circuitized substrate including many dielectric and conductive layers and devices such as chips positioned thereon and coupled thereto (especially with solder bonds), the greater the likelihood that a successfully operating product able to meet many of today's rigorous standards will result.

The following U.S. Patents describe various circuitized substrate structures, some including power cores. The citation thereof is not an admission that any are prior art to the instant invention.

In U.S. Pat. No. 5,120,339 for "Method For Fabricating a Low Thermal Expansion Coefficient Glass Fiber-Reinforced Polymer Matrix Composite Substrate And Composite Substrate", granted Jun. 9, 1992 by Markovich et al., there is described a method of making a composite substrate which comprises the steps of providing a substrate of glass fibers, applying to this substrate a liquid sol-gel wherein said sol-gel comprises a metal alkoxide, sintering the sol-gel to convert it to the glass phase or mixed organic-inorganic gel phase and then applying a coating of a polymer, thus forming the composite substrate. In one example, the polymer is described as being a thermosetting one and the sol-gel is described as being a silica-based sol-gel.

In U.S. Pat. No. 5,418,689 for "Printed Circuit Board Or Card For Direct Chip Attachment And Fabrication Thereof", granted May 23, 1995 by Alpaugh et al., there is described a PCB product wherein the dielectric substrate can include a thermoplastic and/or thermosetting resin. Thermosetting polymeric materials include epoxy, phenolic base materials, polyimides and polyamides. Examples of some phenolic type materials include copolymers of phenol, resorcinol, and cresol. Examples of suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers. "FR4" epoxy compositions contain 70-90 parts of brominated polyglycidyl ether of bisphenol-A and 10-30 parts of tetrakis (hydroxyphenyl) ethane tetraglycidyl ether cured with 3-4 parts of dicyandiamide, and 0.2-0.4 parts of a tertiary amine, all parts being parts by weight per hundred parts of resin solids. Another "FR4" epoxy composition may contain about 25 to about 30 parts by weight of a tetrabrominated digylcidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750 and about 55 to about 65 parts per weight of at least one epoxidized, nonlinear novolak having at least 6 terminal epoxy groups; along with suitable curing and/or hardening agents. A still further "FR4" epoxy composition contains 70 to 90 parts of brominated polyglycidyl ether of bisphenol-A and 10 to 30 parts of tetrakis (hydroxyphenyl) ethane tetraglycidyl ether cured with 0.8-1 phr of 2-methylimidazole. Still other "FR4" epoxy compositions employ tetrabromobisphenol-A as the curing agent along with 2-methylimidazole as the catalyst.

In U.S. Pat. No. 5,574,630 for "Laminated Electronic Package Including A Power/Ground Assembly", granted Nov. 12, 1996 by Kresge et al., there is described a power/ground structure and associated circuitized substrate in which the coefficient of thermal expansion of the power/ground structure and associated substrate are closely matched to each other. The substrate is formed of organic electrically insulating material having electrical circuitry thereon which carries an integrated circuit chip. The power/ground assembly is formed of alternating layers of organic insulating material and at least two layers of electrically-conducting material, typically copper, one of the layers of electrically-conducting material forming a power connection and another layer of the electrically-conducting material forming a ground plane. There is also at least one additional layer of a structural material having a relatively high Young's Modulus and a CTE of less than about 10 ppm/degree C. Invar or copper-clad Invar are described as preferred materials for this structure. The electrically conducting copper material and the Invar are selected in thickness and number such that, together with the electrically insulating material, the composite CTE of the power/ground structure closely matches that of the substrate.

In U.S. Pat. No. 5,620,782 for "Method Of Fabricating A Flex Laminate Package", granted Apr. 15, 1997 by Davis et al., there is described a parallel processor packaging structure and a method for manufacturing the structure. The structure is described as comprising flexible strips, which are discrete subassemblies. These subassemblies are themselves a laminate of at least one internal power core, at least one signal core, with a layer of dielectric there-between. The dielectric is a polymeric dielectric having a dielectric constant less than 3.5, as a polyimide or a perfluorocarbon polymer, or, in a preferred exemplification, a multi-phase composite of a polymeric dielectric material having a low dielectric constant and having a low dielectric constant, low coefficient of thermal expansion material dispersed there-through. Preferably the composite has a dielectric constant less than 3.5, and preferably below about 3.0, and in a particularly preferred embodiment below about 2.0. This is achieved by the use of a low dielectric constant pefluorocarbon polymer matrix, filled with a low coefficient of thermal expansion and preferably low dielectric constant filler. The perfluorocarbon polymer is chosen from the group consisting of perfluoroethylene, perfluoroalkoxies, and copolymers thereof. The dispersed low dielectric constant material is a low dielectric constant, low coefficient of thermal expansion, particulate filler. Exemplary low dielectric constant particulate filler are chosen from the group consisting of silica particles, silica spheres, hollow silica spheres, aluminum oxide, aluminum nitride, zirconium oxide, titanium oxide, and the like. The power core may be a copper foil, a molybdenum foil, or Copper-Invar-Copper (CIC) laminate foil.

In U.S. Pat. No. 5,652,055 for "Matched Low Dielectric Constant, Dimensionally Stable Adhesive Sheet", granted Jul. 29, 1997 by King et al., there is described an adhesive sheet (or "bond ply") material suitable to serve as adhesive layers in a variety of adhesive applications, such as in circuit board laminates, multi-chip modules, and in other electrical applications. The adhesive sheet is described as being constructed from an expanded PTFE material. Preferably, the material is filled with inorganic filler and is constructed as follows: A ceramic filler material is incorporated into an aqueous dispersion of dispersion-produced PTFE. The filler in small particle form is ordinarily less than 40 microns in size, and preferably less than 15 microns. The filler is introduced prior to co-coagulation in an amount that will provide 10 to 60%, and preferably 40 to 50% by weight filler in the PTFE, in relation to the final resin-impregnated composite. The filled PTFE dispersion is then co-coagulated, usually by rapid stirring. The coagulated filled PTFE is then added. The filled material is then lubricated with a common extrusion lubricant, such as mineral spirits or glycols, and then extruded. The extrudate is usually calendered, and then rapidly stretched 1.2 to 5000 times, preferably 2 times to 100 times, per this patent, at a stretch rate of over 10% per second, at a temperature of between 35 degrees C. and 327 degrees C. The lubricant can be removed from the extrudate prior to stretching, if desired. The resulting expanded porous filled PTFE is then imbibed with adhesive by dipping, calendaring, or doctor blading on a varnish solution of about 2% to 70% adhesive in solvent. The wet composite is then affixed to what is referred to as a "tenter" frame, and subsequently "B-staged" at or about 165 degrees C. for 1 to 3 minutes. The resulting sheet adhesive typically consists of: (a) 9 to 65 weight percent PTFE; (b) 9 to 60 weight percent inorganic filler, in the form of particulate; and (c) 5 to 60 weight percent adhesive imbibed within the porous web structure.

In U.S. Pat. No. 5,847,327 for "Dimensionally Stable Core For Use In High Density Chip Packages", granted Dec. 8, 1998 by Fischer et al., there is described a dimensionally stable core for use in high density chip packages. The stable core is a metal core, preferably copper, having clearance holes therein. Dielectric layers are provided concurrently on top and bottom surfaces of the metal core. Metal cap layers are provided concurrently on top surfaces of the dielectric layers. Blind or through holes are then drilled through the metal cap layers and extend into the dielectric layers and clearances formed in the metal core. If an isolated metal core is provided, then the holes do not extend through the clearance holes in the copper core. The stable core reduces material movement of the substrate and achieves uniform shrinkage from substrate to substrate during lamination processing of the chip packages. Lasers are used to form the through holes. Alternating layers of copper and a dielectric comprised of adhesive, filler and expanded poly-tetrafluoroethylene (ePTFE) are also described.

In U.S. Pat. No. 6,073,344 for "Laser Segmentation of Plated Through-Hole Sidewalls To Form Multiple Conductors", granted Jun. 13, 2000 by Japp et al., there is described a method for generating multiple conductor segments within a PTH of a PCB which utilizes laser light to define the segmented surfaces bounding a hole in the PCB. Two embodiments of this method are a subtractive process and an additive process. The subtractive process starts with a PTH and uses a laser to remove vertical strips of the PTH conductive lining to form multiple conductive segments. The additive process applies a seeding material to a bare hole, removes vertical strips of the seeding material via laser scanning, and applies an electrically conductive material to the seeded surfaces to form multiple conductive segments.

In U.S. Pat. No. 6,259,037 for "Polytetrafluoroethylene Thin Film Chip Carrier", granted Jul. 10, 2001 by Feilchenfeld et al., there is described an organic chip carrier particularly useful with "flip chips" (typically bonded onto a package top layer using the aforementioned C4 process). The carrier comprises an organic dielectric layer, a first layer of circuitry disposed on the dielectric layer, an organic conformational coating disposed over the first layer of dielectric and the first layer of circuitry, and a layer of fine line circuitry. The fine line circuitry has a line width of about two mils or less and a space between lines of preferably about 1.1 mils or less. Preferably, the dielectric layer is free of woven fiberglass. The coating, referred to as a "conformal" coating, preferably has a dielectric constant of about 1.5 to about 3.5, and a percent planarization of greater than about 30%. This patent further describes "compensators" which are three layered structures comprised of a first layer of copper, a second layer of 36% nickel-63% iron alloy (which has a CTE of close to zero in the operating layer of the carrier), and a third layer of copper. Preferably a compensator comprises 75% of a 36% nickel-63% iron alloy, and 25% copper. A suitable 36% nickel-63% iron alloy is available under the trademark Invar, from Texas Instruments. Alternatively, the compensator is formed of a single metal such as Invar. The choice of the material for the compensator, together with the choice of material for the dielectric, allegedly controls the CTE of the carrier. Preferably the compensator has a thickness of from about 0.001 to about 0.009 inches, preferably about 0.006 inches. The ground planes may be formed of copper or Copper-Invar-Copper (CIC) or other conductive material as is well known.

In U.S. Pat. No. 6,323,436 for "High Density Printed Wiring Board Possessing Controlled Coefficient of Thermal Expansion With Thin Film Redistribution Layer", granted Nov. 27, 2001 by Hedrick et al., PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. This aramid reinforcement matte is comprised of a random (in-plane) oriented mat of p-aramid (poly (p-phenylene terephthalamide)) fibers comprised of Kevlar (Kevlar is a registered trademark of E. I. duPont deNemours and Company), and has a dielectric constant of 4.0 as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degree Celsius (hereinafter C.) when combined with a thermosetting resin, the final composite described in this patent is said to possess a CTE which can be controlled and adjusted to match that of silicon or semiconductor chips in the range of about 3 to about 10 ppm/degree C. The thermoplastic liquid crystal polymer (LCP) paper is a material called Vecrus (Vecrus is a trademark of Hoechst Celanese Corp.), which uses the company's Vectra polymer as part thereof (Vectra also being a trademark of Hoechst Celanese Corp.). According to this patent, the paper has a dielectric constant of 3.25, a dissipation factor of 0.024 at 60 Hertz (Hz), a UL 94-V rating and an in-plane CTE of less than 10 ppm/degree. C. The alleged advantages of this material over the aramid mat are the lower dielectric constant and very low moisture absorption, allegedly less than 0.02%. The non-woven aramid or LCP paper is used in conjunction with a thermosetting resin to form the final composite substrate. Examples of thermosetting resins useful in this patent include epoxy, cyanate ester, bismaleimide, bismaleimide-triazine, maleimide or combinations thereof. The resin-impregnated low CTE reinforcement is then partially cured to a "B"-stage to form the pre-preg material, and then the pre-preg material is cut, stacked, and laminated to form a sub-composite with exterior copper sheets.

In U.S. Pat. No. 6,329,603 for "Low CTE Power and Ground Planes", granted Dec. 11, 2001 by Japp et al., there is described various conductive materials that have low CTEs and that are used for power and ground plane structures. Fibrous materials (such as carbon, graphite, glass, quartz, polyethylene, and liquid crystal polymer fibers) with low CTEs are metallized to provide a resultant conductive material with a low CTE. Such fibers may be metallized in the individual state thereof and then formed into a fabric, or these materials may be formed into a fabric and then metallized or a combination of both metallizations may be used. In addition, a graphite or carbon sheet may be metallized on one or both sides to provide a material that has a low CTE and high conductivity. These metallized, low CTE power and ground planes may be laminated with other planes/cores into a circuitized substrate, or laminated into a core which is then laminated with other planes/cores into a circuitized substrate. Examples of such substrates include PCBs and LCCs some examples of which are simply referred to as chip carriers. This patent describes using a conductive fiber layer in which a preferred method of making this layer is to add 40 percent by volume of copper powder to a fiber or fiber/resin layer. During lamination, the copper should distribute evenly throughout the fiber layer. Other conductive fillers may be used, along with other types of layer materials.

In U.S. Pat. No. 6,344,371 for "Dimensionally Stable Core For Use In High Density Chip Packages and a Method of Fabricating Same", granted Feb. 5, 2002 by Fischer et al., there is described a method for forming a dimensionally stable "core" for use in a chip package, the method comprising the steps of forming a metal layer with clearance holes therein, placing a first dielectric layer on a top surface of the metal layer and placing a second dielectric layer on a bottom surface of the metal layer, these first and second dielectric layers each comprising an expanded poly-tetrafluoroethylene material having an initial void volume and a mean flow pore size, and a mixture substantially evenly distributed throughout this initial void volume containing a particulate filler and an adhesive resin. The particulate filler is described as being a collection of individual particles having an average particle size wherein a ratio of the mean flow pore size to the average particle size is greater than a specified number. The method further includes placing a metal cap layer on each of, and in direct contact with, the top surface of one dielectric layer and the bottom surface of the other dielectric layer.

In U.S. Pat. No. 6,465,084 for "Method and Structure For Producing Z-Axis Interconnection Assembly of Printed Wiring Board Elements", granted Oct. 15, 2002 by Curcio et al., there is described a method of forming a "core" and forming a composite wiring board (substrate). The core has an electrically conductive coating on at least one face thereof. At least one opening is formed through the structure extending from one face to the other and through each conductive coating. An electrically conductive material is dispensed in each of the openings extending through the conducting coating. At least a portion of the surface of the conductive coating on one face is removed to allow a nub of the conductive material to extend above the substrate face and any remaining conductive material to thereby form a core that can be electrically joined face-to-face with a second core member or other circuitized structure.

In U.S. Pat. No. 6,638,607 for "Method and Structure For Producing Z-Axis Interconnection Assembly of Printed Wiring Board Elements", granted Oct. 28, 2003 by Curcio et al., there is described a method of forming a composite wiring board, using a "member." The member includes a dielectric substrate. Adhesive tape is applied to at least one face of this substrate and at least one opening is formed through the substrate extending from one face to the other and through each adhesive tape. An electrically conductive material is dispensed in each of the openings and partially cured. The adhesive tape is removed to allow a nub of the conductive material to extend above the substrate face to form a wiring structure with other elements.

In U.S. Pat. No. 6,645,607 for "Method and Structure For Producing Z-Axis Interconnection Assembly of Printed Wiring Board Elements", granted Nov. 11, 2003 by Curcio et al., there is described a method of forming a "core" for use as part of a composite wiring board. The core has an electrically conductive coating on at least one face of a dielectric substrate. At least one opening is formed through the substrate extending from one face to the other and through each conductive coating. An electrically conductive material is dispensed in each of the openings extending through the conducting coating. At least a portion of the surface of the conductive coating on one face is removed to allow a nub of the conductive material to extend above the substrate face and any remaining conductive material to thereby form a core that can be electrically joined face-to-face with a second core member or other circuitized structure.

In U.S. Pat. No. 6,826,830 for "Multi-layered Interconnect Structure Using Liquid Crystalline Polymer Dielectric", granted Dec. 7, 2004 by Egitto et al., there is described a multi-layered interconnect structure and method of formation. In a first embodiment, first and second liquid crystal polymer dielectric layers are directly bonded, respectively, to first and second opposing surface of a thermally conductive layer, with no extrinsic adhesive material bonding the thermally conductive layer with either the first or second dielectric layer. In a second embodiment, first and second substructures are directly bonded, respectively, to first and second opposing surfaces of a dielectric joining layer, with no extrinsic adhesive material bonding the dielectric joining layer with either the first or second substructures.

In U.S. Pat. No. 6,829,823 for "Method of Making a Multilayered Interconnect Structure", granted Dec. 14, 2004 by Downes, Jr., et al., there is described a method of making a multi-layered interconnect structure in which first and second electrically conductive members are formed on first and second dielectric layers, respectively. The dielectric layers are formed on opposing surfaces of a thermally conductive layer. A first and second electrically conductive layer is formed within the first dielectric layer. The second electrically conductive layer includes shielded signal conductors and is positioned between the first electrically conductive layer and the thermally conductive layer. A plated through hole (PTH) formed through the interconnect structure is electrically connected to one of the first and second electrically conductive members and to one of the shielded signal conductors. A third dielectric layer, described as comprising a resin of an allylated polyphenylene ether, is formed on the first dielectric layer and on portions of the first electrically conductive members, substantially overlies the PTH and includes a high density interconnect layer for providing an electrical path from an electronic device to the shielded signal conductors.

In U.S. Pat. No. 6,887,779 for "Integrated Circuit Structure", granted May 3, 2005 by Alcoe et al., there is described a semiconductor chip carrier having an increased chip connector and plated through hole density. In particular, a substrate is described having a plurality of plated through holes therein and a fatigue resistant redistribution layer thereon. The redistribution layer includes a plurality of vias selectively positioned over and contacting the plated through holes. The substrate further includes a ground plane, two pair of signal planes, and two pair of power planes. A ground plane is described a comprising copper-Invar-copper (CIC), signal planes described as comprising copper. The power planes are formed over each of the second dielectric layers, these first power planes also being of copper. In one example, the dielectric layers comprise a PTFE (polytetrafluroethylene) material filled with silicon particles available from Rogers Corporation. In the alternative, the dielectric layers may be any other similar dielectric materials such as epoxy resins, polyimide, polyphenylene ethers, etc.

In U.S. Pat. No. 6,944,946 for "Porous Power and Ground Planes For Reduced PCB Delamination and Better Reliability", granted Sep. 20, 2005 by Japp et al., a power core is described which comprises a dielectric layer sandwiched between two copper layers. These copper layers may be thicker than copper layers used for circuit layers in other parts of the final circuitized substrate structure to provide extra current carrying capability. In this example, one copper layer becomes a power plane of the final substrate while the other copper layer becomes a ground plane. One or both of these layers may be patterned and may include openings (called clearance openings) therein. These clearance areas prevent the power and ground planes from contacting subsequent plated through holes that are drilled in these locations after the power core has been pressed into a composite and holes have been drilled and plated. A preferred material suitable for use in the power and ground planes is sintered metal. Sintered metal is formed of metal particles that are bonded together under pressure and heat. Sintered metal power planes may be formed by pressing high melt temperature, high electrical conductivity metal particles (such as copper) coated with a low melt metal (such as tin) together under heat and pressure. The tin-coated copper particles fuse together to form an electrically conductive but porous sheet. Additional materials for creating porous, conductive power and ground planes may be loosely referred to as fibrous conductive materials. These preferred additional materials include small wires formed into a sheet (or "fabric"), metallized fabrics (such as polyester), metallized carbon fiber fabric, and metallized glass fibers. Fabrics can further be broken into woven fabric (fabrics having some non-random structure) and random paper fabrics. Random paper fabrics are generally made from fibers placed in random orientations.

In U.S. Pat. No. 7,078,816 for "Circuitized Substrate", granted Jul. 18, 2006 by Japp et al., there is described a dielectric layer including an epoxy resin material and a filler comprised of particles having a size within the range of from about 200 Angstroms to about 35 microns, these particles comprising from about 10 percent to about 80 percent by volume of the dielectric layer, said first dielectric layer not including continuous fibers, semi-continuous fibers or the like as part thereof and further including a plurality of conductive thru-holes therein having a pattern density of from about 5,000 to about 10,000 holes per square inch of the dielectric layer. The layer is said to have a dielectric constant within the range of from about 3.5 to about 4.0.

In U.S. Pat. No. 7,301,108 for "Multi-layered Interconnect Structure Using Liquid Crystalline Polymer Dielectric", granted Nov. 27, 2007 by Egitto et al., there is described multi-layered interconnect structure and method of formation. In a first embodiment, first and second liquid crystal polymer (LCP) dielectric layers are directly bonded, respectively, to first and second opposing surface of a thermally conductive layer, with no extrinsic adhesive material bonding the thermally conductive layer with either the first or second LCP dielectric layer. In a second embodiment, first and second two signal, one power (2S1P) substructures are directly bonded, respectively, to first and second opposing surfaces of an LCP dielectric joining layer, with no extrinsic adhesive material bonding the LCP dielectric joining layer with either the first or second 2S1P substructures.

In U.S. Pat. No. 7,429,789 for "Fluoropolymer Dielectric Composition For Use In Circuitized Substrates and Circuitized Substrate Including Same", granted Sep. 30, 2008 by Japp et al., there is described a dielectric composition adapted for forming a dielectric layer for use in circuitized substrates, this dielectric composition comprising first and second fluoropolymers, the first fluoropolymer having a high melting point from 300 degrees Celsius to 350 degrees Celsius and the second fluoropolymer having a low melting point from 200 degrees Celsius to 280 degrees Celsius. The composition further includes first and second inorganic fillers, the first inorganic filler having a high thermal conductivity from 600 W/m.K degrees to 2000 W/m.K degrees and the inorganic second filler having a low thermal conductivity from 5 W/m.K degrees to 400 W/m.K degrees.

The resulting dielectric layer including this dielectric composition is said to have a dielectric constant of from about 2.8 to about 3.6.

In U.S. Pat. No. 7,508,076 for "Information Handling System Including A Circuitized Substrate Having A Dielectric Layer Without Continuous Fibers", granted Mar. 24, 2009 by Japp et al., there is described an information handling system having as part thereof a circuitized substrate with a first layer of dielectric material including a resin material with a predetermined quantity of particles therein and not including continuous fibers, semi-continuous fibers or the like as part thereof, and at least one circuitized layer positioned on the dielectric first therein and not including continuous fibers, semi-continuous fibers or the like as part thereof, and at least one circuitized layer positioned on the dielectric first layer.

As understood from the following, the present invention defines a new power core structure for use in circuitized substrates such as PCBs and LCCs and a method of making such a power core. The invention further defines the package structures in which such cores are used. These packages, as a result of the power core taught herein, are able to assure a proper match between CTEs of the individual elements of package structure, thus assuring a reliable product capable of successfully performing for extended periods of time and of meeting today's rigorous standards.

It is believed such a power core, method of making same, and circuitized substrate package utilizing one or more of such cores will represent a significant advancement in the art.

SUMMARY OF THE INVENTION

It is a primary object of the present invention to enhance the circuitized substrate art, and particularly that part of the art involving power core assemblies.

It is another object of the invention to provide a power core and an associated circuitized substrate including same which will possess the many advantageous features defined herein and otherwise discernible from the instant teachings.

It is yet another object of the invention to provide a method of making such a power core and an associated circuitized substrate.

It is still another object of the invention to provide such a method which may be accomplished in a relatively facile manner and at relatively low cost in comparison to some known substrate manufacturing processes.

According to one embodiment of the invention, there is provided a power core for use in circuitized substrates, said power core comprising a first layer of a first low expansion dielectric material including first and second opposing sides and at least one opening extending there-through, second and third layers of a second low expansion dielectric material different than said first low expansion dielectric material and positioned on said first and second opposing sides of said first layer of low expansion dielectric material, respectively, and within said at least one opening, first and second conductive layers positioned on said second and third layers of said low expansion dielectric material, respectively, and not within said at least one opening and at least one thru hole positioned within said at least one opening and extending substantially from said first conductive layer to said second conductive layer.

According to another embodiment of the invention, there is provided a circuitized substrate comprising a power core including a first layer of a first low expansion dielectric material including first and second opposing sides and at least one opening extending there-through, second and third layers of a second, different low expansion dielectric material than said first low expansion dielectric material and positioned on said first and second opposing sides of said first layer of low expansion dielectric material, respectively, and within said at least one opening, first and second conductive layers positioned on said second and third layers of said low expansion dielectric material, respectively, and not within said at least one opening and at least one thru hole positioned within said at least one opening and electrically isolated from said first and second conductive layers and a plurality of alternating layers of dielectric material and conductive material on at least one side of said power core and bonded thereto, selected ones of said layers of conductive material adapted for carrying electrical signals.

According to another embodiment of the invention, there is provided method of making a power core for use in a circuitized substrate, method comprising providing a first layer of a first low expansion dielectric material including first and second opposing sides, forming at least one opening extending through said first layer of said first low expansion dielectric material from said first opposing side to said second opposing side, positioning second and third layers of a second low expansion dielectric material different than said first low expansion dielectric material on said first and second opposing sides of said first layer of low expansion dielectric material, respectively, bonding said second and third layers of said second low expansion dielectric material different than said first low expansion dielectric material to said first layer of said first low expansion dielectric material such that at least some of said second low expansion dielectric material of both of said second and third layers extends within and substantially fills said at least one opening, forming first and second conductive layers on said second and third layers of said low expansion dielectric material, respectively, and not within said at least one opening and forming at least one thru hole within said at least one opening having said second low expansion dielectric material of both of said second and third layers therein.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein

FIGS. 5 and 6 are side elevational views, in section, which illustrate the steps of forming through holes within the structure of FIG. 4, according to one embodiment of the invention. FIG. 6 is a partial view and on a much enlarged scale over the view of FIG. 5, for enhanced illustration purposes;

The sectioning provided in the drawing figures is not meant to indicate a particular material but only the presence of the structures defined herein. The various materials of these structures are defined in greater detail herein. Accordingly, the sectioning provided is not meant to limit the invention to any particular material.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from drawing figure to drawing figure.

Definitions

The following terms will be used herein and are understood to have the meanings associated therewith.

By the term "circuitized substrate" as used herein is meant to include multilayered structures including a plurality of dielectric layers and a plurality of circuitized conductive layers typically arranged in an alternating manner. Examples of dielectric materials suitable for use in such structures include fiberglass-reinforced or non-reinforced epoxy resins, polytetrafluoroethylene (Teflon), polyimides, polyamides, cyanate resins, photoimageable materials, ceramic and other like materials, or combinations thereof. Examples of materials for the conductive layers include copper or copper alloy. If the dielectric is a photoimageable material, it is photoimaged or photopatterned, and developed to reveal the desired circuit pattern, including the desired opening(s) as defined herein, if required. The dielectric material may be curtain coated or screen applied, or it may be supplied as a dry film or in other sheet form. Typical examples of such circuitized substrates include PCBs and LCCs.

By the term "circuitized substrate assembly" as used herein is meant to include at least one and possibly more of such circuitized substrates having at least one and possibly more power cores as defined herein which form integral parts thereof, and at least one electrical component (defined below) mounted on and electrically coupled to the assembly.

By the term "electrical component" as used herein is meant components such as semiconductor chips, resistors, capacitors and the like, which are adapted for being positioned on the external conductive surfaces of such substrates as PCBs and chip carriers, and possibly electrically coupled to other components, as well as to each other, using, for example the PCBs or chip carrier's internal and/or external circuitry. The circuitized substrate assemblies formed in accordance with the teachings herein are readily adaptable for having one or more such electrical components positioned thereon and electrically coupled to the internal circuitry thereof, as mentioned, and also having these components coupled to each other if so desired.

By the term "high speed" as used herein to define the substrate signal speed capabilities is understood to mean signals within a frequency range of from about 3.0 to about 10.0 Gigabits Per Second (GPS) and possibly even faster. The circuitized substrate assemblies formed herein are capable of operating at such high frequencies if desired.

By the term "high expansion dielectric material" as used herein to define the dielectric materials used as part of the invention's power core is meant a material having a coefficient of thermal expansion (CTE) of greater than about 25 parts per million (ppm)/deg. C in the X-Y (in plane) direction and greater than about 70 ppm/deg. C in the Z (out of plane) direction, said directions taken from a cross-section of said material.

By the term "information handling system" as used herein is meant to define any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

By the term "low expansion dielectric material" as used herein to define the dielectric materials used as part of the invention's power core is mean a material having a CTE within the range of from about 7 to about 20 ppm/deg. C in the X-Y direction and less than about 50 ppm/deg. C in the Z direction, said directions taken from a cross-section of said material.

By the term "power core" as used herein is meant a multi-layered structure comprising at least one dielectric layer and at least two conductive layers positioned on opposite sides of the dielectric layer. The materials used to form the power core of the invention are defined herein. One of the conductive layers will function as a power plane while the other conductive layer may function as a ground layer, but may also function in another manner, including as a signal layer. Alternatively, both conductive layers may function as power planes for the substrate. It is understood from the teachings herein that the primary function of the power cores taught herein is to become an integral part of circuitized substrates, particularly an LCC or PCB.

By the term "thru hole" as used herein is meant to include three different types of electrically conductive holes formed within a circuitized substrate. As mentioned, it is known in circuitized substrate constructions to provide conductive interconnections between various conductive layers (including power, ground and signal) of the substrate. For some applications, it is desired that electrical connection be made with almost if not all of the conductive layers. In such a case, a thru-hole (which includes a layer or layers of conductive material located on walls of openings of the dielectric material which support same) is typically provided through the entire thickness of the substrate is referred to as a PTH. For other applications, it is often desired to also provide electrical connection between the circuitry on one face of the board to a depth of only one or more of the inner circuit layers. These are referred to as "blind vias", which pass only part way through (into) the substrate. In still another case, such multi-layered substrates often require internal "vias" which are located entirely within the structure and covered by external layering, including both dielectric and conductive layers. Such internal "vias", also referred to as "buried vias", are typically formed within a first formed sub-composite, e.g., a power core, which is then bonded to other sub-composites and/or dielectric and/or conductive layers to form the final, thicker multilayered circuitized substrate. Therefore, for purposes of this application, the term "thru hole" is meant to include all three types of such electrically conductive openings, each of which includes one or more layers of conductive material located on internal walls of the openings formed within the chosen dielectric material.

As understood from the description herein, a primary object of the present invention is to provide a power core structure readily adapted for use as part of a circuitized substrate such as a LCC or PCB wherein the power core possesses key attributes such as a low CTE, high stiffness and good cracking resistance. The circuitized substrate utilizing such a power core will in turn possess the key attributes of being of relatively lower cost than many known substrates and yet able to meet the high performance obligations demanded in today's environment.

Figure 1:
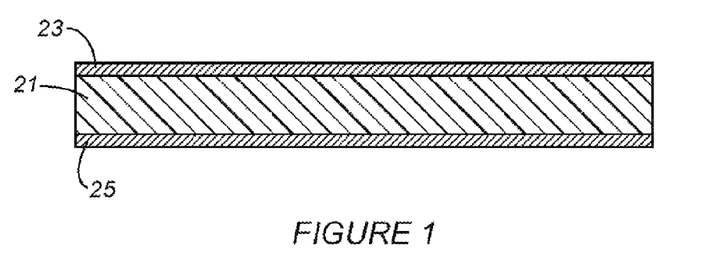
FIGS. 1 through 4 are side elevational views, in section, which illustrate the steps of forming a power core according to one embodiment of the invention, the power core not including through holes therein at this stage.

In FIG. 1, there is shown the initial elements of a structure destined to be a power core in accordance with one embodiment of this invention. This structure includes a first dielectric layer 21 of low expansion material. The preferred material for layer 21 is a low moisture-absorbing thermosetting resin such as epoxy, polyphenylene ether, bismaleimide triazine or polyimide and, in a preferred embodiment, has an initial thickness of from about 2.95 mils to about 9.84 mils (a mil is understood to represent $\frac{1}{1000}$ of an inch). Other low expansion thermosetting resins are possible. This material further includes woven fiberglass cloth as part thereof (the cloth being impregnated with the resin), for added reinforcement, in addition to amorphous spherical silica. Other inorganic particulates than silica may be utilized, including, for example, aluminum oxide, boron nitride, and aluminum nitride, to name a few. The silica (or other inorganic particulate) particles each have a size within the range of about 0.003 mils to about 1.377 mils, and, in one embodiment, the silica comprises from about 3 to about 49 percent by weight of the resin material. In this particular embodiment, the fiberglass cloth occupies from about 35 percent to about 55 percent by weight of the resin. Any conventional PCB fiberglass cloth should suffice for use here, with one particular example being sold under the product designation (number) 2116, and available from JPS Glass, PO Box 242, Slater Road, Slater, S.C. The fiberglass cloth serves to contribute to the stiffness, CTE control and cracking resistance in the final structure. The presence of the silica further reduces the CTE, lowers electrical losses during operation of the product, and improves thermal stability.

In a preferred embodiment as shown in FIG. 1, layer 21 includes outer layers 23 and 25 of conductive material, preferably copper or copper alloy, on opposite sides thereof. In this embodiment, each layer is comprised of what is called ½ ounce copper, having a thickness of from about 0.621 mils to about 0.729 mils. The copper is laminated onto interim layer 21 using a conventional lamination process for bonding such materials onto known dielectric substrates. In one example, this lamination was accomplished at temperatures within the range of from about 180 to about 230 degrees C. and at laminating pressures in the range of about 200 Pounds Per Square Inch (PSI) to about 1000 PSI. Further definition is not deemed necessary. The primary purpose of these outer metal layers is to assist in this initial compression of the dielectric layer having the fiberglass cloth and silica therein. Following the lamination of both layers, the compressed dielectric layer 21 possesses a reduced thickness within the range of about 2.5 mils to about nine mils, or approximately a fifteen percent reduction in thickness over the original thickness. It is further understood that such compression results in a substantially equal distribution of both the silica and fiberglass cloth though-out the layer. Understandably, the copper outer layers, being metal, do not undergo a thickness reduction.

An important feature of the present invention is that fiberglass or any similar cloth fabric material, conventionally used in many PCB and LCC substrates, will remain in many portions of the final layer 21 for the produced power core, thus assuring the desired attributes defined above, but that it will not be present in any resulting thru holes formed through the core for the purposes defined also above. The presence of fiberglass cloth is considered potentially harmful to thru hole formation (especially when using lasers) in circuitized products primarily because of the glass fibers. These fibers are known to contribute to an electrical failure mode known as OAF (cathodic/anodic filament growth) which is an electrical shorting failure occurring when dendritic metal filaments grow along an interface (typically a glass fiber/epoxy resin interface), creating an electrical path between two features which should remain electrically isolated. Whether continuous (like woven cloth) or semi-continuous (like chopped fiber mattes), glass fiber lengths are substantial in comparison to the common distances between isolated internal features and thus glass fibers can be a significant detractor for PCB insulation resistance reliability. While use of glass mattes composed of random discontinuous chopped fibers might serve to abate the problem of laser drilled hole quality, because such mattes still contain fibers with substantial length compared to internal board feature spacing, use of the glass fiber containing mattes typically offers relatively little relief form the problem of OAF. In addition, glass cloth has drastically different absorption and heat of ablation properties than thermosetting resins. In a typical woven glass cloth, the density of glass a laser might encounter can vary from approximately 5 percent in a window area to approximately 50 percent by volume (or more) in an area over a cloth "knuckle." This wide variation in encountered glass density leads to problems obtaining the correct laser power for each hole and may result in wide variation in thru hole quality. The present invention overcomes these problems by assuring that there will be substantially no fiber glass filaments in the area of the dielectric layer 21 in which thru holes are to be formed.

The FIG. 1 structure may now be profiled, meaning it is cut to the desired width and length dimensions desired for subsequent processing. In the next step, shown in FIG. 2, a plurality of openings 27 are formed within the structure. In one example, a total of as many as about 70,000 such openings may be formed. This of course depends on the operational requirements for the power core and is not limiting of this invention. In the broadest aspects, the FIG. 2 structure needs only one such opening 27. Openings 27 are very small in diameter, and, in one embodiment, may each possess a diameter of only about 6 mils. Openings 27 may be formed using mechanical drills or a suitable laser (one example being an ultraviolet (UV) Nd:YAG laser). If using such a laser, pulse energy of about 0.05 milli-joules to 0.51 milli-joules may be used for this multi-opening formation process.

Figure 2:
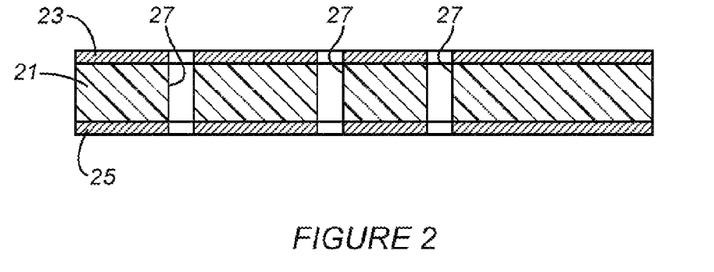
Figure 3:
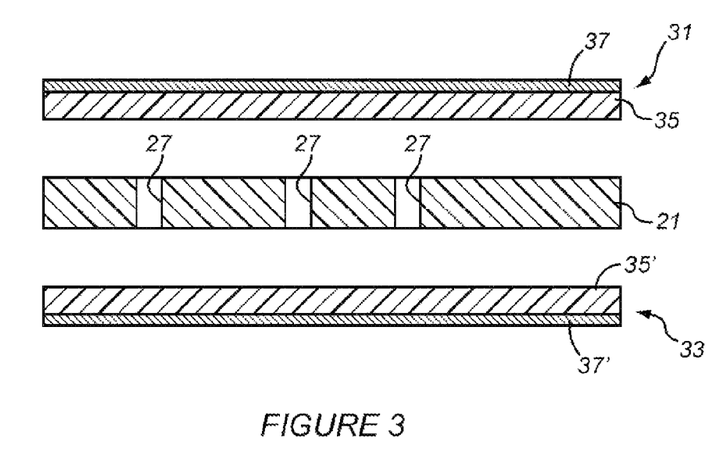

The FIG. 2 structure is now subjected to a blanket etching process in which the metal (if used, copper or copper alloy) of layers 23 and 25 is removed, leaving only the singular layer 21 as now seen in FIG. 3. Cupric chloride, a known etchant for PCB manufacturing, may be used as the etchant solution, and conventional etching apparatus employed. Further definition is thus not considered essential at this time.

Figure 4:
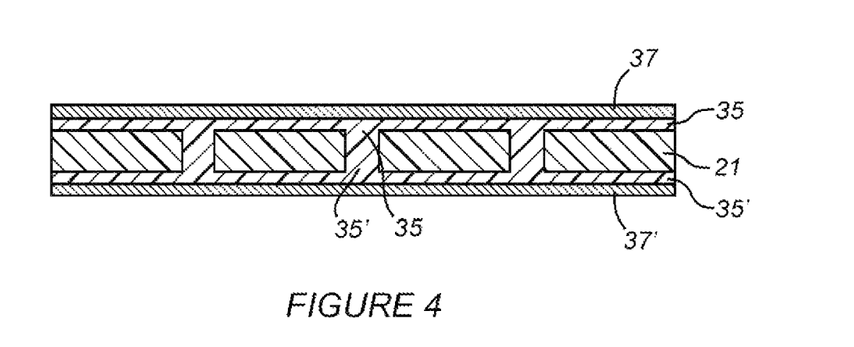

In FIG. 3, a pair of members 31 and 33 is now aligned on opposite sides of sole remaining layer 21 as shown, members 31 and 33 to be bonded to layer 23 to form the structure of FIG. 4. Each member 31 and 33 is comprised of a layer (35, 35') of low expansion dielectric material having bonded (e.g., coated or laminated) thereto a layer of conductive material (37, 37'). Examples of such members may also be referred to in the art as Resin Coated Copper or RCCs. Significantly, however, layers 35 and 35' do not include fiberglass either in cloth, matt, or other form. That is, there is no glass or the like fibers in these layers. Instead, each of these low expansion dielectric layers is comprised of a low moisture-absorbing thermosetting resin such as epoxy or bismaleimide triazine or polyimide, and thus may be of a similar resin material as initial layer 21. In addition, each resin includes a percentage by weight of inorganic particulates therein, a preferred inorganic being amorphous spherical silica as used in layer 21. As with layer 21, other inorganic particulates may be utilized, including, for example, aluminum oxide, boron nitride, and aluminum nitride, to name a few. The silica (or other inorganic particulate) particles each have a size within the range of about 0.003 mils to about 0.905 mils, and, in one embodiment, the silica occupies from about 30 percent to about 60 percent by weight of the resin material, greater than the corresponding percentage in layer 21. In one embodiment, each layer 35 and 35' may possess an initial thickness of from about 1.53 mils to about 2.4 mils.

Each of the conductive layers 37 and 37' is preferably of copper or copper alloy, which in turn may be similar to the initial metallurgy for now removed layers 23 and 25. Each conductive layer may possess a thickness of from about 0.46 mils to about 1.4 mils. With the members 31 and 33 aligned as shown (the individual dielectric layers 35 and 35' facing interim layer 21), the FIG. 3 structure is now laminated to form the integral structure of FIG. 4. Conventional PCB lamination equipment may be used for this lamination, and in one example, the compression may occur at temperatures of from about 180 degrees C. to about 230 degrees C., at pressures within the range of about 200 PSI to 1000 PSI. This lamination results in the multi-layered structure shown in FIG. 4 having an overall thickness of only from about 4.5 mils to about 12.5 mils. As understood, the thickness of the outer conductive layers remains the same following compression while the three low expansion dielectric layers each do compress, resulting in the total thickness cited above. Significantly, as seen in FIG. 4, none of the metal of the outer conductive layers enters the openings 27, but instead only the low expansion dielectric material (resin and inorganic particulates) does, to completely fill each opening. Because material from both layers 35 and 35' enter and fill each opening, both numbers are used when referencing the center opening in FIG. 4.

Following this lamination process, it may be desirable to again profile the structure to meet required length and width dimensions. Such profiling may be conducted using conventional PCB profiling apparatus, as was possible for the aforementioned profiling step.

Figure 5:
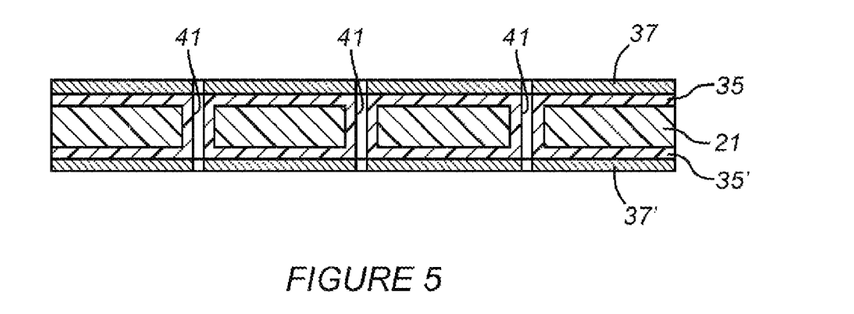

In FIG. 5, a series of openings 41 is formed within the FIG. 4 structure, each within a corresponding opening 27 now filled with the low expansion, glass-free dielectric material from layers 35 and 35'. Understandably, this material is sufficiently rigid from the foregoing compression to enable such opening 41 formation. In one embodiment, each opening 41 has a diameter of from about 0.6 mils to about 2.2 mils, obviously significantly less than the corresponding diameter of the accommodating openings 27. Openings of such small diameters are further indication of the extremely small dimensions for the invention, thus able to meet the demanding miniaturization requirements of today's technology. Opening 41 formation may be accomplished using mechanical drills or suitable laser equipment conventionally used in the PCB art for thru hole formation. One laser capable of accomplishing this is an ultraviolet (UV) Nd:YAG laser. If using such a laser, pulse energy of about 0.05 milli-joules to 0.50 milli-joules may be used for this multi-opening formation process.

Figure 6:
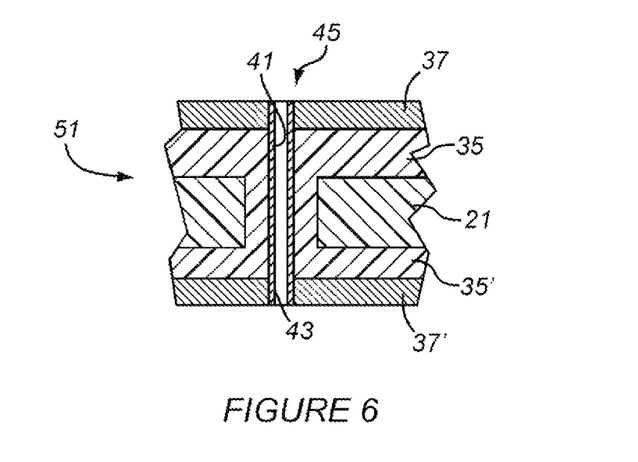

Openings 41 are now rendered conductive by the application of a conductive layer 43 on the internal walls thereof, as seen in FIG. 6. Only one opening 41 and layer 43 are shown in the much enlarged and partial view of FIG. 6, for ease of illustration. Layer 43 may be formed using electroplating, either electro-less or electrolytic. It is also within the scope of this invention to instead fill each opening 41 with suitable conductive paste and use it instead of the plated conductive layer 43. Such paste may also be used in addition to the plated layer. If layer 43 is applied by plating, the metal is preferably copper or copper alloy, with a resulting layer thickness of only about 0.3 mils to about 0.8 mils. If electro-less plating is employed, the FIG. 5 structure is immersed in a solution of conductive monomers, e.g., pyrrole monomer, the solution also possibly containing a seed material such as palladium-tin. Further, a reducing agent such as formaldehyde may be added to a solution of copper ions, which are chemically reduced at the properly catalyzed surface. The electro-less copper solution may also typically contain complexing agents, stabilizers and/or accelerating agents that, together, function to optimize copper grain growth and stabilize plating rate. The result of applying conductive material to openings 41 in the manner defined above is the formation of a plurality of thru holes 45 within the FIG. 6 structure, which may now be defined as a power core 51. Power core 51 is now adapted for being used as part of a larger circuitized substrate (e.g., as shown and defined below). Actually, more than one such core may be used in these substrates, again depending on the operational requirements demanded of the final product.

Figure 7:
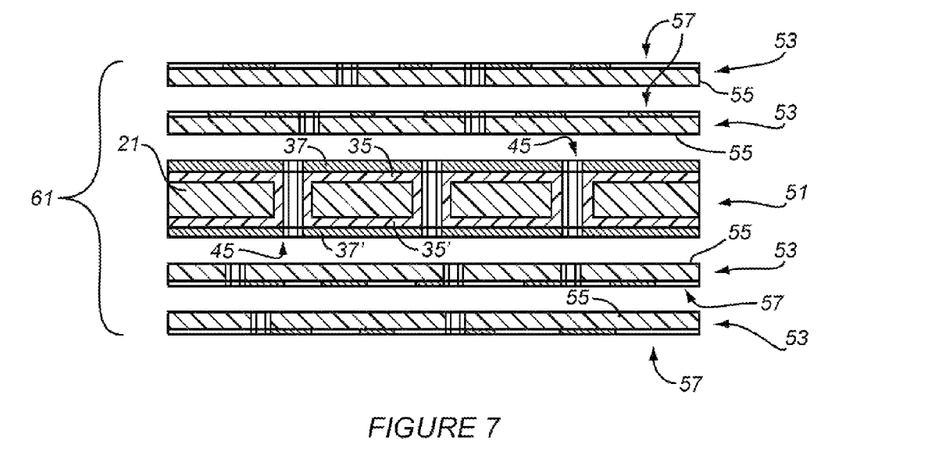
FIG. 7 is a side elevational view, in section, illustrating the forming of a circuitized substrate using the power core of the invention, according to one embodiment of the invention.

In FIG. 7, power core 51 is shown as being aligned with a plurality (four being shown but more or less may be used) of layered substrates 53 which each include one or more (only one shown per substrate 53 in these examples) dielectric layers 55 each having bonded thereto one or more (only one shown per substrate 53 in these examples) conductive layers 57. As shown, layers 57 are circuitized, meaning each layer may include defined pads, open areas and circuit lines forming a required pattern.

In one embodiment, a subtractive circuitizing process known in the art is used. This is accomplished by forming an image of the desired circuit pattern on a solid layer already bonded to the underlying dielectric layer, this image typically formed by applying an organic photoresist coating over the metal layer. UV light is then projected through a mask onto the photoresist, the mask containing a pattern of shapes that block selected parts of the impinging UV light. When using negative photoresist, the areas of the photoresist that are not exposed to the UV light are removed during the subsequent development step. Chemical etching is then used to remove the exposed surface metal. Next, the remaining photoresist is stripped, leaving the desired metal pattern. Other known circuitizing methods may also be used.

With the substrate 53 circuitization complete, the individual substrates and one or more of the power cores 51 are aligned as shown and laminated using conventional PCB lamination processing. Further description is not considered necessary. As is often done in the art, once the multilayered substrate 61 is formed, it is also possible to form thru holes therein, which may be afore-defined "blind vias" extending a pre-defined distance within the substrate from one or both opposite sides, as well as PTHs which extend through the entirety of the formed substrate, Examples of all three of the defined thru holes are shown in the example of FIG. 7. It is also within the scope of the invention not to circuitize the outer layers 57 until the full substrate has been laminated. Still further, it is also within the scope of the invention to align previously formed thru holes in selected ones of the substrates with those in others to form a longer thru hole extending entirely or partially through the final substrate. Other approaches known in the circuitized substrate art are also possible for the invention defined herein.

Figure 8:
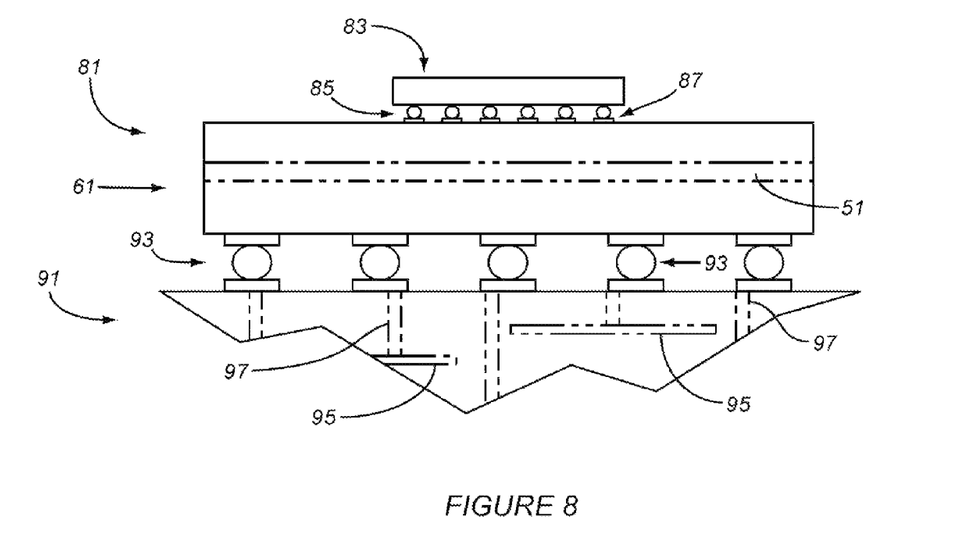
FIG. 8 is a side elevational view illustrating a circuitized substrate assembly according to one embodiment of the invention, this assembly including a circuitized substrate formed in accordance with one embodiment of the invention wherein a power core forms part of the circuitized substrate and, therefore, the complete circuitized substrate assembly.

In FIG. 8, there is shown a circuitized substrate assembly 81 according to one aspect of this invention. Assembly 81 includes a circuitized substrate 61 such as that formed above and an electrical component 83 such as a semiconductor chip positioned thereon and electrically coupled thereto, e.g., using a plurality of solder joints (bonds) 85 as is known in the art. Several such components 83 may be positioned and electrically coupled to substrate 61, which in turn includes one or more power cores 51 (one shown hidden) of the present invention therein. Circuitized substrate assembly 81, comprised of substrate 61 and component(s) 83, may in turn be positioned on a larger, host circuitized substrate such as a host PCB 91, using conventional solder joints 93. PCB 91 may in turn include internal circuit planes 95 (hidden), thru holes 97 (also hidden), etc. as is known in the PCB art. Assembly 81 is ideally suited for use as part of an information handling system (defined above), e.g., a personal computer, mainframe computer or computer server.

Figure 9:
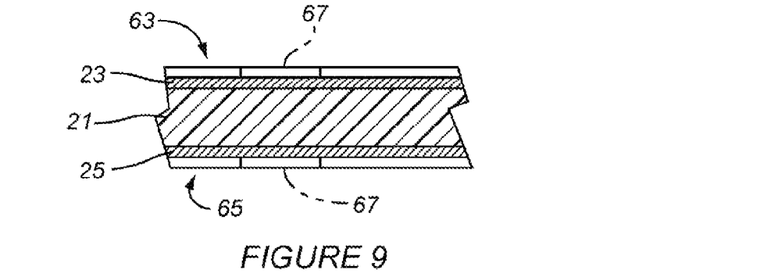
FIGS. 9 through 11 are partial side elevational views, in section, and on an enlarged scale over the views of FIGS. 1 through 5, which illustrate an alternative embodiment of forming a power core having at least one opening therein.
Figure 10:
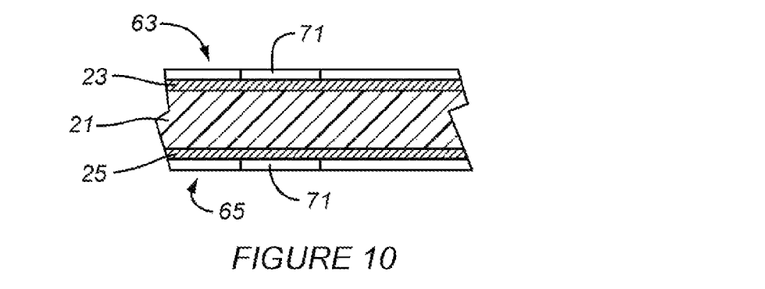
Figure 11:
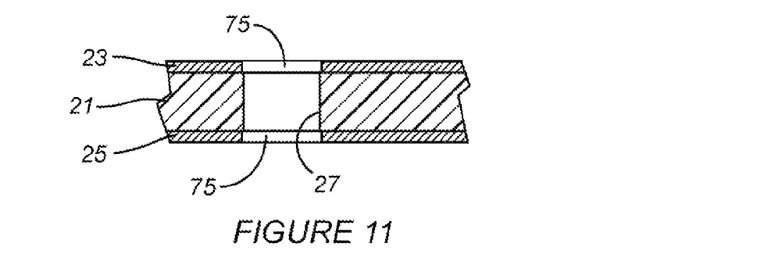

FIGS. 9 through 11 illustrate a method of forming initial openings 27' within a substrate similar to that shown in FIG. 1, such openings 27' being similar in purpose as openings 27 in the FIG. 1 substrate. These openings may be formed either through direct ablation using a UV laser or by conventional PCB photolithographic processing known in the art.

In FIG. 1, the substrate, including the three similar layers 21, 23 and 25, has two layers 63 and 65 of conventional photoresist deposited thereon, in much the same manner defined above for forming circuit patterns. The photoresist is then exposed through a patterned mask, in turn defining open regions 67 (FIG. 9) therein. As seen in FIG. 9, at least two of these open regions 67 are aligned directly opposite each other.

The open regions of photo-resist are now developed and subsequently removed, leaving at least one pair of aligned openings 71 (FIG. 10). Thereafter, etching using a suitable etchant (e.g., cupric chloride) occurs, removing the metal in layers 23 and 25 which have been exposed by the now open regions there-above, forming aligned openings 75 (FIG. 11). Openings 27' are now formed through the exposed dielectric of layer 21, using a suitable laser. In one embodiment, a carbon dioxide laser may be used. Another suitable laser for this purpose is a UV Nd:YAG laser, similar to that used above to create the opening 27. One significant feature of using a laser at this point is that the remaining metallurgy of layers 23 and 25 assist in defining the portions of dielectric being removed to form these openings 27'. In effect, the remaining metal of layers 23 and 25 as shown in FIG. 11 functions as a highly precise mask due to the fine definition possible when using the defined circuitization process. That is, this metal prohibits the laser energy from passing there-through except where openings 71 have been formed. The substrate shown in FIG. 11 is now subjected to the same steps as for the substrate of FIG. 2, in which the outer substrates 31 and 33 are aligned and bonded thereto, etc.

Thus there has been shown and described a new and unique power core structure for use in circuitized substrates such as LCCs and PCBs, as well as a method of making same. There has also been shown and described a circuitized substrate adapted for utilizing one or more of the power cores of the invention, as well as a circuitized substrate assembly capable of utilizing such a circuitized substrate. The power core (and the corresponding substrates and substrate assemblies utilizing same) possesses several new and unique features in comparison to known power cores, including the use of fiber glass as part of a first dielectric layer to assure the needed stiffness and cracking resistance for the eventually formed structure. Further, the presence of fiber glass and silica enables the substrate manufacturer to limit the CTE of the core to a low value (in one embodiment, only about 13 ppm/deg. C, allowing the subsequently formed circuitized substrate (e.g., an LCC) to satisfactorily pass required thermal cycling obligations. Still further, the complete absence of such fiber glass fibers or the like from within the openings formed through the core assures the prevention of circuit defects such as OAF shorting when holes are formed and subsequent electrical bias is applied. Even further, the invention does not require the use of exotic materials or highly complex manufacturing steps which would add to the overall cost for the final products using this invention. As still further understood from the foregoing, the use of three dielectric layers where the outer two possess dielectric compositions substantially similar to the common, interior dielectric layer assures the necessary compatibility between such layers to result in a product having the many properties defined above and understood from a careful reading of this specification.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A power core for use in circuitized substrates, said power core comprising:
   a first layer of a first low expansion dielectric material including first and second opposing sides and at least one opening extending there-through;
   second and third layers of a second low expansion dielectric material different from said first low expansion dielectric material and positioned on said first and said second opposing sides of said first layer of low expansion dielectric material, respectively, and within said at least one opening;
   first and second conductive layers positioned on said second and said third layers of said low expansion dielectric material, respectively, and not within said at least one opening; and
   at least one thru hole positioned within said at least one opening and extending substantially from said first conductive layer to said second conductive layer.

2. The power core of claim 1 wherein said first low expansion dielectric material comprises thermosetting resin, fiberglass and a quantity of inorganic particulates.

3. The power core of claim 2 wherein said inorganic particulates each has a size within the range of about 0.10 mils to about 1.4 mils.

4. The power core of claim 3 wherein said inorganic particulates comprise silica, said silica occupying from about 3 to about 49 percent by weight of said thermosetting resin and said fiberglass cloth constitutes from about 35 to about 55 percent by weight of the resin.

5. The power core of claim 1 wherein said second low expansion dielectric material different from said first low expansion dielectric material comprises thermosetting resin and a quantity of inorganic particulates, said second low expansion dielectric material not including fiberglass cloth or the like therein.

6. The power core of claim 5 wherein said inorganic particulates of said second low expansion dielectric material each has a size within the range of about 0.10 mils to about 1.00 mil.

7. The power core of claim 6 wherein said inorganic particulates of said second low expansion dielectric material comprise silica constituting from about 30 to about 75 percent by weight of said thermosetting resin.

8. The power core of claim 1 wherein each of said first and said second conductive layers comprise copper or copper alloy material and are positioned on said second and third layers of said low expansion dielectric material, respectively, and not within said at least one opening.

9. The power core of claim 1 wherein said at least one thru hole positioned within said at least one opening includes at least one layer of copper or copper alloy material.

10. A circuitized substrate comprising:
   a power core including a first layer of a first low expansion dielectric material including first and second opposing sides and at least one opening extending there-through;
   second and third layers of a second, different low expansion dielectric material from said first low expansion dielectric material and positioned on said first and said second opposing sides of said first layer of low expansion dielectric material, respectively, and within said at least one opening, first and second conductive layers positioned on said second and third layers of said low expansion dielectric material, respectively, and not within said at least one opening, and at least one thru hole positioned within said at least one opening and electrically isolated from said first and said second conductive layers; and
   a plurality of alternating layers of dielectric material and conductive material on at least one side of said power core and bonded thereto, selected ones of said layers of conductive material adapted for carrying electrical signals.

11. The circuitized substrate of claim 10 wherein said first low expansion dielectric material comprises thermosetting resin, fiberglass and a quantity of inorganic particulates.

12. The circuitized substrate of claim 11 wherein said inorganic particulates each has a size within the range of about 0.10 mils to about 1.4 mils.

13. The circuitized substrate of claim 11 wherein said inorganic particulates comprise silica constituting from about 3 to about 49 percent by weight of said thermosetting resin, and said fiberglass cloth constituting from about 35 to about 55 percent by weight of the resin.

14. The circuitized substrate of claim 10 wherein said second low expansion dielectric material different from said first low expansion dielectric material comprises thermosetting resin and a quantity of inorganic particulates, said second low expansion dielectric material not including fiberglass cloth or the like therein.

15. The circuitized substrate of claim 14 wherein said inorganic particulates of said second low expansion dielectric material each has a size within the range of about 0.10 mils to about 1.00 mil.

16. The circuitized substrate of claim 15 wherein said inorganic particulates of said second low expansion dielectric material comprise silica constituting from about 30 to about 75 percent by weight of said thermosetting resin.

17. The circuitized substrate of claim 10 wherein each of said first and said second conductive layers comprise copper or copper alloy material, and are positioned on said second and said third layers of said low expansion dielectric material, respectively, and not within said at least one opening.

18. The circuitized substrate of claim 10 wherein said at least one thru hole positioned within said at least one opening includes at least one layer of copper or copper alloy material.

19. The circuitized substrate of claim 10 wherein said alternating layers of dielectric material and conductive material comprise epoxy resin and copper or copper alloy, respectively.

20. A method of making a power core for use in a circuitized substrate, the method comprising:
  providing a first layer of a first low expansion dielectric material including first and second opposing sides;
  forming at least one opening extending through said first layer of said first low expansion dielectric material from said first opposing side to said second opposing side;
  positioning second and third layers of a second low expansion dielectric material different from said first low expansion dielectric material on said first and said second opposing sides of said first layer of low expansion dielectric material, respectively;
  bonding said second and said third layers of said second low expansion dielectric material different from said first low expansion dielectric material to said first layer of said first low expansion dielectric material such that at least some of said second low expansion dielectric material of both of said second and said third layers extends within and substantially fills said at least one opening;
  forming first and second conductive layers on said second and said third layers of said low expansion dielectric material, respectively, and not within said at least one opening; and
  forming at least one thru hole within said at least one opening having said second low expansion dielectric material of both of said second and said third layers therein.

21. The method of claim 20 wherein said forming of said at least one opening extending through said first layer of said first low expansion dielectric material from said first opposing side to said second opposing side is accomplished using at least one of the group: a laser, and a mechanical drill.

22. The method of claim 20 wherein said bonding said second and said third layers of said second low expansion dielectric material different from said first low expansion dielectric material to said first layer of said first low expansion dielectric material such that at least some of said second low expansion dielectric material of both said second and said third layers extends within and substantially fills said at least one opening is accomplished using lamination.

23. The method of claim 22 wherein said lamination is accomplished at temperatures of from about 180 degrees C. to about 230 degrees C. and at pressures within the range of about 200 PSI to 1000 PSI.

24. The method of claim 20 wherein said forming of said first and said second conductive layers on said second and third layers of said low expansion dielectric material, respectively, is accomplished prior to said bonding of said second and said third layers of said second low expansion dielectric material different from said first low expansion dielectric material to said first layer of said first low expansion dielectric material.

25. The method of claim 24 wherein said first and second conductive layers are formed on said second and third layers of said low expansion dielectric material, respectively, by coating.

26. The method of claim 20 wherein said forming of said at least one thru hole within said at least one opening within said first layer of said first low expansion dielectric material having said second low expansion dielectric material of both of said second and said third layers therein is accomplished by forming at least one opening within said second low expansion dielectric material of both of said second and said third layers within said at least one opening within said first layer of said first low expansion dielectric material and then forming a layer of conductive material on said at least one opening within said second low expansion dielectric material of both of said second and said third layers within said at least one opening within said first layer of said first low expansion dielectric material.

27. The method of claim 26 wherein said forming of said at least one opening within said second low expansion dielectric material of both said second and said third layers within said at least one opening within said first layer of said first low expansion dielectric material is accomplished using a laser.

28. The method of claim 27 wherein said forming said layer of conductive material on said at least one opening within said second low expansion dielectric material of both said second and said third layers within said at least one opening within said first layer of said first low expansion dielectric material is accomplished using electroplating.

29. The method of claim 20 further including bonding a plurality of alternating layers of dielectric material and conductive material on at least one side of said power core to form a circuitized substrate.

* * * * *